(12) United States Patent
Lu et al.

(10) Patent No.: US 7,703,991 B2
(45) Date of Patent: Apr. 27, 2010

(54) FLIP-CHIP MOUNTABLE OPTICAL CONNECTOR FOR CHIP-TO-CHIP OPTICAL INTERCONNECTABILITY

(75) Inventors: Daoqiang Lu, Chandler, AZ (US); Gilroy J. Vandentop, Tempe, AZ (US); Henning Braunisch, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 400 days.

(21) Appl. No.: 11/124,033

(22) Filed: May 6, 2005

(65) Prior Publication Data

US 2006/0251360 A1    Nov. 9, 2006

(51) Int. Cl.
G02B 6/36 (2006.01)

(52) U.S. Cl. .................... 385/88
(58) Field of Classification Search ............ 385/88, 385/92

See application file for complete search history.

(56) References Cited

U.S. PATENT DOCUMENTS

| | | | |
|---|---|---|---|
| 5,337,388 A * | 8/1994 | Jacobowitz et al. | 385/76 |
| 5,631,988 A * | 5/1997 | Swirhun et al. | 385/89 |
| 5,768,456 A * | 6/1998 | Knapp et al. | 385/49 |
| 6,268,655 B1 * | 7/2001 | Farnworth et al. | 257/723 |
| 6,406,195 B1 * | 6/2002 | Hammond et al. | 385/88 |
| 6,684,007 B2 * | 1/2004 | Yoshimura et al. | 385/31 |
| 6,963,119 B2 * | 11/2005 | Colgan et al. | 257/432 |
| 2002/0150357 A1 * | 10/2002 | Hammond et al. | 385/92 |

OTHER PUBLICATIONS

Hiramatsu et al: "Optical Path Redirected Three-dimensional Lightguide Connectors for High-speed Interconnection Modules" Electronic Components and Tech. Conf. pp. 1530-1536 IEEE 2004 XP078038365.
Maeno et al: "Development of Mini-MT Ferrule Using Short-Cycle Injection Molding" Furukawa Review, No. 19, 2000 pp. 143-148.
Mohammed et al: "Optical I/O Technology for Digital VLSI" Photonics Packaging and Integration IV, vol. 5358 Bellingham, WA, USA, pp. 60-63+, 2004.
Morozova et al: "Controlled Solder Self-alignment Sequence for an Optoelcetronic Module without Mechanical Stops", IEEE 078033857 Elec. Components and Tech. Conf. 1997, pp. 1188-1193.
Pimpinella et al: "Optical Connectors and Variable Losses in Coupling Multimode Fibers" At&T Bell Laboratories, Whippany, NJ IEEE 0780313437 1993.

* cited by examiner

*Primary Examiner*—Uyen-Chau N Le
*Assistant Examiner*—Hoang Tran
(74) *Attorney, Agent, or Firm*—Kevin A. Reif

(57) ABSTRACT

An optical connector comprises a housing having a cavity extending there through to accept a mating connector. The connector comprises no optical components. Dummy solder bonding pads positioned on the connector allow the connector to be automated flip-chip bonded over a substrate waveguide.

7 Claims, 6 Drawing Sheets

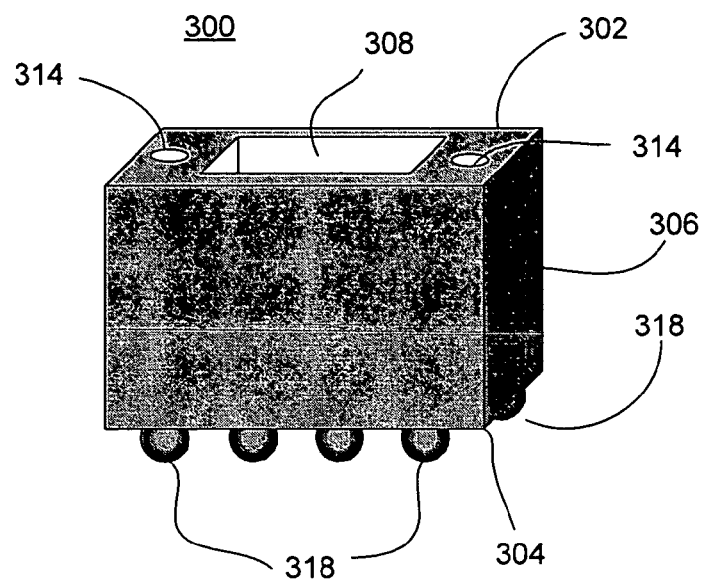
Fig. 3A
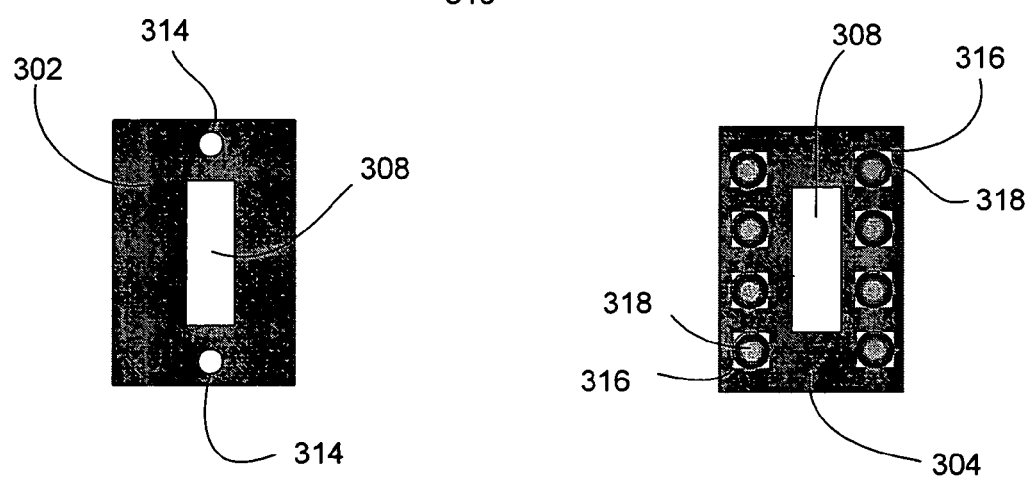
Fig. 3B
Fig. 3C

FLIP-CHIP MOUNTABLE OPTICAL CONNECTOR FOR CHIP-TO-CHIP OPTICAL INTERCONNECTABILITY

FIELD OF THE INVENTION

Embodiments of the present invention relate to optical connectors and, more particularly, to flip-chip mountable optical connectors.

BACKGROUND INFORMATION

With the proliferation of optical communication systems the use of small fiber optic connectors has become more prevalent. Optical connectors are typically made of plastic and are useful components for joining optical fibers or waveguide arrays at their ends. Optical connectors are typically pluggable, meaning that they may allow for repeated connection and disconnection. There are many types of optical connectors available on the market today.

FIG. 1 shows an example of a Mechanically Transferable or "MT"-style connector. Some also refer to "MT" as Multi-Terminal connectors. MT connectors are one type of what are known as small form factor (SFF) connectors. MT connectors are popular for parallel optical data transmission since they provide a high fiber count in a dense connector package comprising an arrayed configuration of fiber holes aligned in a single ferrule. Commercially available MT connectors may comprise anywhere from two to twenty-four connection points and in the future will likely comprise many times that number.

FIG. 1 shows a female portion 100 and a male portion 102 of the connector. A female input 101 and a male input 103 may comprise either optical fibers or waveguide arrays intended to be optically connected to each other. Both the female portion 100 and the male portion 102 hold arrays of corresponding exposed optical connection points 104 and 106 in ferrules, 108 and 110. The connection points 104 and 106 may be aligned by a pair of guide pins 112, often made of metal, at the end of the male portion 102, which join into guide holes 114 on the female portion 100. The MT connector may be locked together by a push and click mechanism or may comprise a fastener (not shown) that clips between the end 116 of the female portion 100 and the end 118 of the male portion 102.

FIGS. 2A, 2B, and 2C show a scenario for attaching a waveguide 101 with an MT connector 100 to a substrate 200. Waveguide 101 may alternatively be a waveguide array. As shown in FIG. 2A, the waveguide 101 is attached to an MT connector 100 precisely. The waveguide 101 and connector 100 are then attached onto a substrate 200 using, for example, an ultra-violet (UV) curable liquid adhesive as shown in FIG. 2B.

As shown in FIG. 2C, an active optical device chip 201 such as a laser or detector or arrays thereof may be flip-chip bonded with solder bumps 202 to the substrate 200 over a 45° mirror 204 positioned at one end of the waveguide 101. Thus, the mirror 204 reflects light to or from the waveguide 101 to the chip 201. A mating MT connector 102 may then be plugged into the waveguide 101 with MT connector 100 on the substrate 200 via guide hole 114 and pin 112 to optically connect the wave guide 101 to external waveguide 103.

Unfortunately, the above described process is a highly manual process and not well suited for automated high-speed manufacturing.

BRIEF DESCRIPTION OF THE DRAWINGS

FIG. 3A is a perspective view of an optical connector according to one embodiment of the invention;

FIG. 3B is a top view of the optical connector shown in FIG. 3A;

FIG. 3C is a bottom view of the optical connector shown in FIG. 3A;

DETAILED DESCRIPTION

Figure 1:
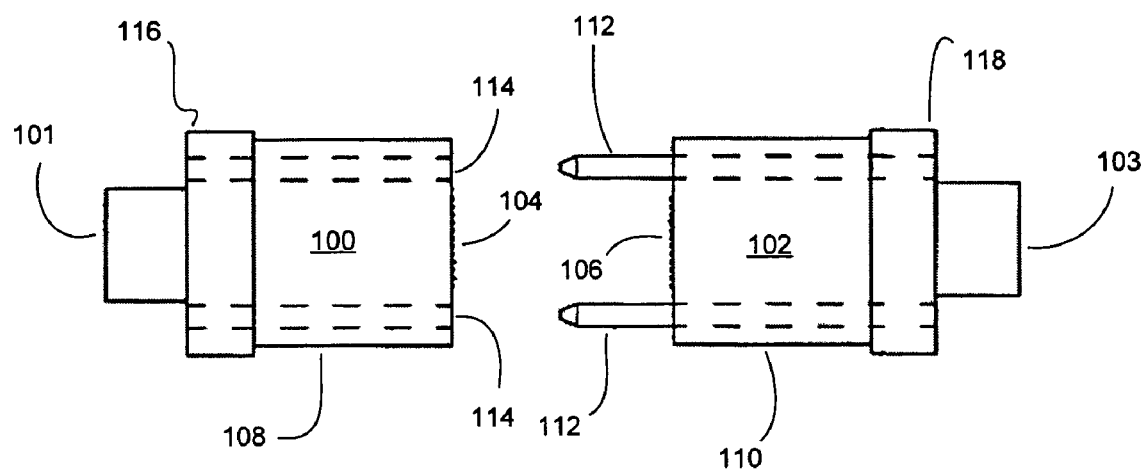
FIG. 1 is a view of an MT-style connector.
Figure 2A:
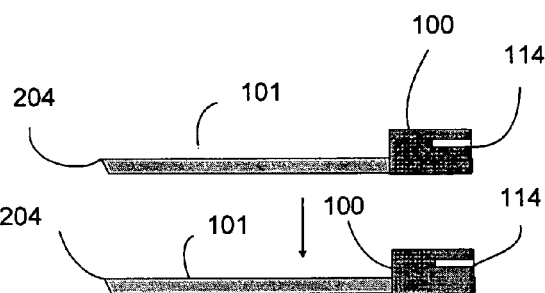
FIGS. 2A, 2B, and 2C illustrate a procedure for attaching a waveguide with an MT-style connector to a substrate.
Figure 2B:
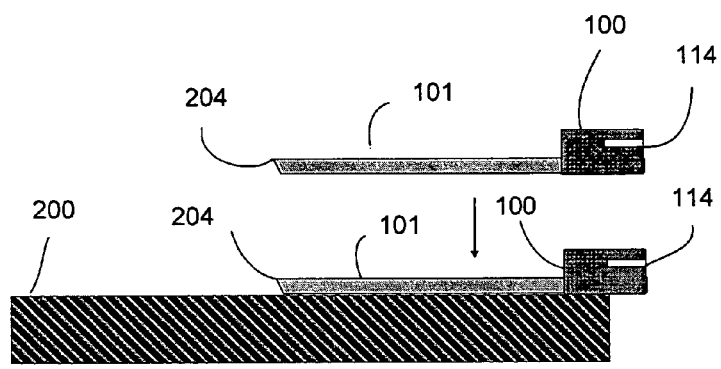
Figure 2C:
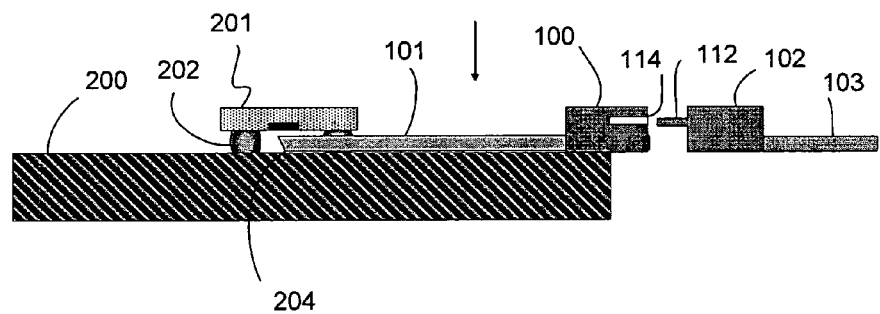

In the following description, numerous specific details are set forth to provide a thorough understanding of embodiments of the invention. One skilled in the relevant art will recognize, however, that embodiments of the invention can be practiced without one or more of the specific details, or with other methods, components, materials, etc. In other instances, well-known structures, materials, or operations are not shown or described in detail to avoid obscuring understanding of this description.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Referring now to FIG. 3A-3C, FIG. 3A shows a plan view of a flipchip mountable connector 300 according to one embodiment of the invention. Similarly, FIG. 3B shows a top side 302 view of the connector 300 and FIG. 3C shows a bottom side 304 view of the connector 300. The connector 300 comprises a housing 306 having a cavity 308 extending there through to accept a mating connector (not shown). Guide pin holes 314 may also be located on the top side 312 of the connector 300 which may or may not extend all the way through the housing 306. As shown in FIG. 3C, dummy solder bonding pads 316 may be positioned on the bottom side 304 of the connector 300 to accept solder balls 318 such that the connector 300 may be flip-chip bonded to a substrate.

The pads 316 are shown arranged in two rows of four pads, however, other configurations may be used in practice. The solder pads 316 may be termed "dummy" pads 316 as they do not make any electrical connections. Rather, they are present to allow the connector 300 to be bonded to a substrate with the precision of automated flip-chip assembly techniques to eliminate manual placement and affixing methods. In particular, passive alignment of the connector to the substrate can be achieved by taking advantage of solder self alignment during assembly.

The connector 300 itself contains no optical elements such as lenses or waveguides found in other such connectors. Thus, the connector 300 may be manufactured at low cost using, for example, precision plastic molding at a high volume and assembled using high volume manufacturing (HVM) assembly processes.

Figure 4:
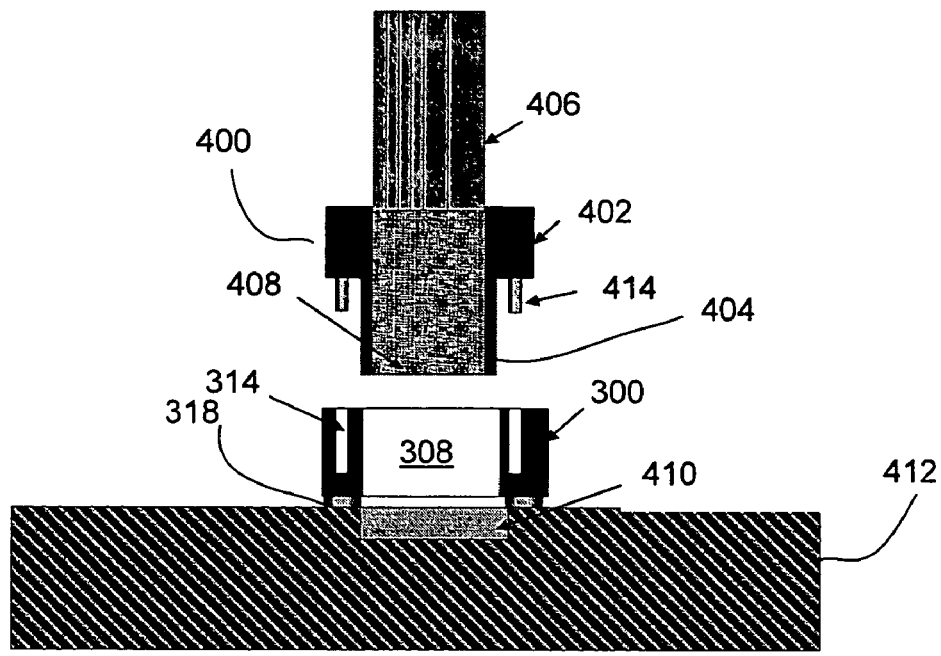
FIG. 4 is a cut-away side view of the optical connector flip-chip bonded to a substrate with a male connector to optically couple an external waveguide to a substrate waveguide.
Figure 5:
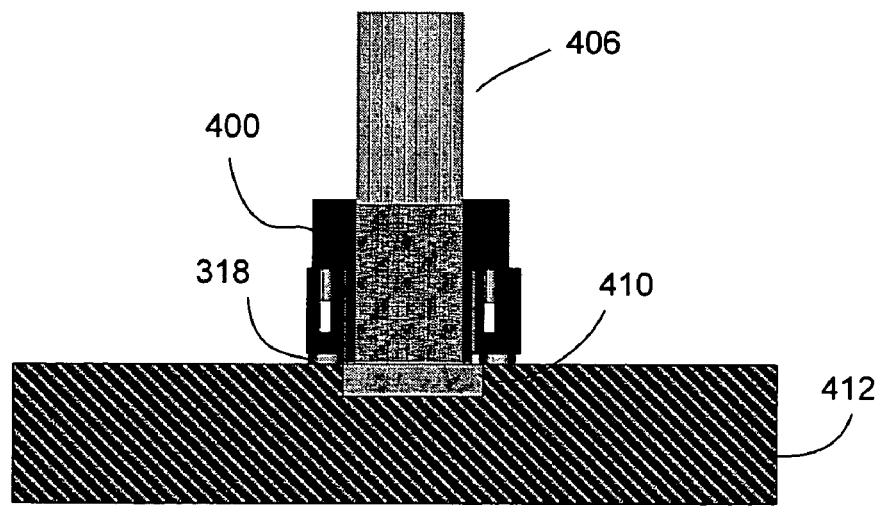
FIG. 5 is a cut-away side view of the optical connector shown in FIG. 4 with the male connector inserted.

FIGS. 4 and 5 show conceptual drawings of the mating mechanics for the connector 300 according to one embodiment of the invention. FIG. 4 includes a mating or male connector 400 which may have a grip portion 402 and a narrower insertion portion 404 shaped to fit inside of the cavity 308 of the female connector 300 which may be flip-chip bonded with solder balls 318 to a substrate 412. An external waveguide or fiber 406 may extend through the male connector 400 with the waveguide end face 408 exposed at the tip of the male connector 400. As shown in FIG. 5, the alignment pins 414 fit into the guide pin holes 314, such that when inserted the waveguide end face 408 makes optical contact with a waveguide 410 associated with the substrate 412. As shown, the waveguide 410 may be embedded in the substrate 412.

Figure 6:
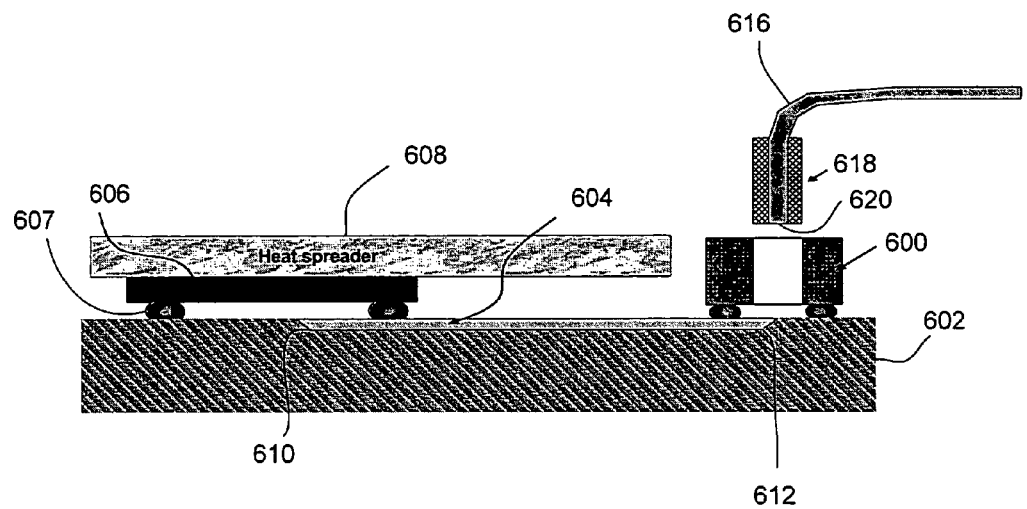
FIG. 6 is a side view of the optical connector vertically oriented to the substrate.

FIG. 6 shows an embodiment of a connector 600 vertically mounted to a substrate 602 according to an embodiment of the invention. A waveguide 604 on or which may be embedded into the substrate 602 spans between the connector 600 and an optoelectronic device 606 such as a laser or photodiode detector or logic device containing suitable optoelectronic devices. The optoelectronic device 606 may be mounted to the substrate via flip-chip techniques using solder balls 607. Likewise, the connector 600 may also take advantage of the automation and precision of flip-chip techniques, and solder self alignment capability to secure the connector 600 over the waveguide mirror 612. A heat sink 608 may optionally be mounted over the optoelectronic device 606 if the device 606 is to be cooled. In this embodiment, mirrors 610 and 612, optimally angled at 45° or near 45° are fabricated at either end of the waveguide 604 and may be used to redirect light traveling through the waveguide into or out of the optoelectronic device 606 and the connector 600. As shown, an external waveguide 616 with a mating connector may butt couple with the integrated waveguide 604 with no micro-lenses required.

According to embodiments of the invention, the connector 600 may be passively aligned using high precision flip-chip techniques and the sold self-alignment capability. When the external connector 618 is inserted into the connector 600 and pushed in all the way the face 620 of the external waveguide 616 comes in close proximity to the top surface of the substrate multimode waveguide array 612. Hence, the centers of the cores of the external waveguide array 616 should be positioned precisely over the centers of the 45° mirrors 612 at the end of the substrate waveguide array 604, to maximize optical coupling and avoid optical loss due to truncation or vignetting.

Flip-chip bonding of the connector 600 allows for precision alignment. Minimal lateral misalignment may be contributed by any of the following:

1. The position of the substrate waveguide apertures with respect to the pads on the substrate on which the connector is mounted: This factor is determined by the substrate technology. Photolithographic techniques with a common mask set will lead to a high accuracy and only small offset for the embedded waveguide, e.g., of 1 . . . 2 μm.

2. The centering of the pads on the connector over the corresponding pads on the substrate: This placement accuracy is determined by solder self-alignment which may have an accuracy of about 2 μm.

3. The position of the pads on the connector with respect to the connector body, in particular the alignment pin holes: When the pads are formed, e.g., using sputtering and a mask, the mask can be aligned using machine vision and utilizing fiducials on the bottom surface of the connector formed by the same molding process used to form the connector itself. Such photolithographic approach should lead to a high accuracy and only small offset, e.g., of 1 . . . 2 μm.

4. The tolerance in the connector dimensions, in particular the precision of the alignment pin holes: The connector is formed using precision molding, e.g., injection molding, known to be capable of excellent dimensional control. The challenging tasks of managing these parameters have been solved by the development of new thermosetting polymers having low molding shrinkage in addition to the upgrading of transfer molding technologies, resulting in the production of MT ferrules with a high dimensional precision of the submicrons order. Thus, we may assume that this contribution will be not worse than 2 μm.

5. The precision of the external MT-type connector including the array of external waveguide apertures: This tolerance is controlled by standard manufacturing of connectorized multimode fiber arrays with an accuracy of a few microns, say 2 μm.

Thus, there are five independent contributions of about 2 μm each, adding up to a total misalignment of about:

$$\sqrt{5 \times (2 \mu m)^2} = 4.47 \mu m.$$

For simplicity, let us round off to 5 μm and consider square apertures. A typical multimode aperture size is 50 μm. If the 5 μm misalignment occurs in the worst-case direction, i.e., diagonally across the apertures of equal size, the resulting optical insertion loss may be about:

$$-10 \, dB \times \log_{10}[(50 \, \mu m - 5 \, \mu m)^2/(50 \, \mu m)^2] = 0.92 \, dB.$$

This estimate is in line with typical optical link budgets that include 1 . . . 1.5 dB loss for each connector in the link (with the total link budget in the order of 10 . . . 15 dB depending on the output power of the source and the sensitivity of the optical receiver). The above 0.92 dB does not include Fresnel losses of about 0.34 dB if no index matching means (such as an index matching fluid) at the aperture surfaces are provided. However, the loss due to misalignment can be reduced significantly if it is possible to couple from a smaller aperture to a larger aperture. For example, 5 μm misalignment from a 50 μm aperture into a 55 μm aperture or from a 45 μm aperture into a 50 μm aperture will lead to no insertion loss at all (0 dB loss due to lateral misalignment) since the apertures are still fully overlapping and no truncation/vignetting occurs.

FIG. 6 may result in a higher profile due to the upright orientation of the connector 600. Hence, in this case the connector 600 may interfere with larger heat spreaders 608. Therefore, the substrate 602 may need to be modified (made a little larger laterally) so that the connector 600 does not interfere with the heat spreader 608, or the heat spreader 608 may need to include a suitable slot to accommodate the connector 600.

Figure 7:
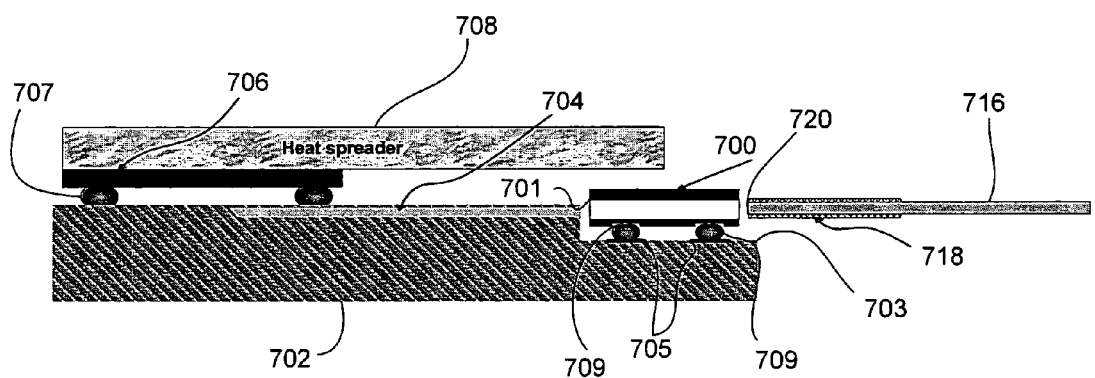
FIG. 7 is a side view of the optical connector horizontally oriented to the substrate.

Referring now to FIG. 7, there is shown an embodiment of the invention having a lower profile where the connector 700 does not interfere with the heat spreader 708. In this case, the substrate 702 may be pre-machined to form a platform 703 where the flip chip connector 700 will be placed. Then dummy solder pads 705 may be deposited on the platform 703. The cut into the substrate 702 comprising the platform 703 is estimated to be about 500 μm deep, compatible with standard FCXGA (flip-chip grid array) substrates. A waveguide 704 on or which may be embedded into the substrate 702 spans between the connector 700 and an optoelectronic device 706. The optoelectronic device 706 may be mounted to the substrate via flip-chip techniques using solder balls 707.

The flip chip mountable connector 700 does not contain any optical components. It has a cavity 701 to receive the MT connector 718 of the external waveguide array 716 and two alignment pin holes which will receive the two alignment pins (not shown) of the MT connector. At the bottom of the flip chip (FC) connector, there are dummy solder bumps 709 that match corresponding pads 705 on the substrate 702.

The solder bump self-alignment also provides alignment of the connector 700 with respect to the substrate waveguide 704 such that, when the external WG array 716 is inserted into the connector 700, the waveguide array 716 aligns automatically to the substrate waveguide 704. The MT connector 718 on the external waveguide array 716 may also need to be modified so that, when the MT connector alignment pins are completely inserted into the alignment holes on the flip chip mountable connector 700, the waveguide array end-face 720 physically contacts and butt couples to the substrate waveguide 704. The mating pieces may include a suitable retention mechanism such as an appropriate clip fixture (not shown).

Figure 8:
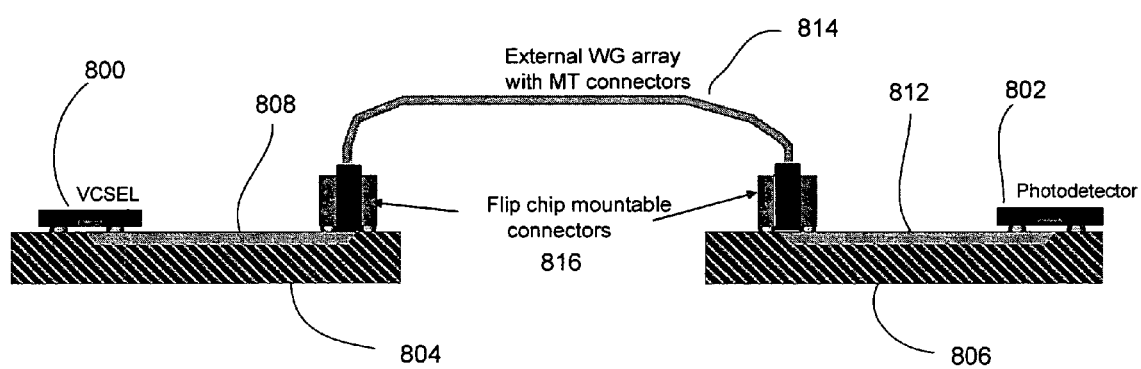
FIG. 8 is a side view showing chip-to-chip optical interconnection according to one embodiment of the invention.

FIG. 8 shows a system according to an embodiment of the invention using the connectors in a chip-to-chip optical interconnect such as may be used to connect central processing unit (CPU) packages. Here, two or more chips 800 and 802 may reside on substrates 804 and 806. It will be recognized that the chips 800 and 802 may also reside on a single substrate. The first chip 800 may include a vertical cavity surface emitting laser (VCSEL) array optically connected via an embedded waveguide 808 to a flip-chip mounted connector 816. Similarly, the second chip 802 may comprise a photodiode (PD) array optically connected via an embedded waveguide 812 to another flip-chip mounted connector 816. In this manner a chip-to-chip optical interconnect may be realized using a fiber optic connector cord 814, for example with male connectors mating to female flip-chip mounted connectors 816.

The above description of illustrated embodiments of the invention, including what is described in the Abstract, is not intended to be exhaustive or to limit the embodiments to the precise forms disclosed. While specific embodiments of, and examples for, the invention are described herein for illustrative purposes, various equivalent modifications are possible, as those skilled in the relevant art will recognize. These modifications can be made to embodiments of the invention in light of the above detailed description.

The terms used in the following claims should not be construed to limit the invention to the specific embodiments disclosed in the specification. Rather, the following claims are to be construed in accordance with established doctrines of claim interpretation.

What is claimed is:

1. An optical connector comprising:
    a female connector, made of an electrically insulative plastic, having no optical components and comprising:
    a cavity extending from a first side to a second side;
    dummy solder bonding pads to flip-chip bond the female connector to a substrate over a waveguide, the dummy solder bonding pads connected only to the electrically insulative plastic; and
    a male connector shaped to fit within the cavity and comprising:
    an external waveguide having an endface at a leading end of the male connector and a second end extending beyond a distal end of the male connector.

2. The optical connector as recited in claim 1, further comprising:
    at least one guide pin hole in the female connector parallel to the cavity.

3. The connector as recited in claim 2, further comprising:
    at least one guide pin on the male connector to fit within the guide pin hole.

4. The connector as recited in claim 3, further comprising:
    a pair of guide pin holes in the female connector and a pair of guide pins on the male connector.

5. A method for optically coupling a first waveguide and a second waveguide, comprising:
    providing a first waveguide along a surface of a substrate;
    providing a female connector comprising a plastic electrically insulative housing having a cavity extending there through;
    providing dummy solder bonding pads on the electrically insulative housing and on the substrate;
    flip-chip bonding the female connector to the substrate with solder balls between the solder bonding pads on the housing and on the substrate, the dummy solder bonding pads to make non-electrical connections; and
    inserting a male connector comprising a second waveguide into the cavity.

6. The method as recited in claim 5, further comprising:
    providing an angled mirror in the first waveguide to reflect light towards the cavity.

7. The method as recited in claim 5, further comprising:
    providing a platform on the substrate to optically align the cavity with an end of the first waveguide.

\* \* \* \* \*